United States Patent
Bakke et al.

(10) Patent No.: US 9,250,418 B2
(45) Date of Patent: Feb. 2, 2016

(54) FABRY-PEROT INTERFEROMETER WITH PIEZOELECTRIC ACTUATOR CONTRACTING IN RADIAL DIRECTION ON MEMBRANE

(75) Inventors: Thor Bakke, Lysaker (NO); Ib-Rune Johansen, Oslo (NO); Andreas Vogl, Oslo (NO); Frode Tyholdt, Oslo (NO); Dag Thorstein Wang, Oslo (NO)

(73) Assignee: SINTEF, Trondheim (NO)

( * ) Notice: Subject to any disclaimer, the term of this patent is extended or adjusted under 35 U.S.C. 154(b) by 588 days.

(21) Appl. No.: 13/394,209

(22) PCT Filed: Sep. 16, 2010

(86) PCT No.: PCT/EP2010/063628
§ 371 (c)(1),
(2), (4) Date: Mar. 5, 2012

(87) PCT Pub. No.: WO2011/033028
PCT Pub. Date: Mar. 24, 2011

(65) Prior Publication Data
US 2012/0162664 A1   Jun. 28, 2012

(30) Foreign Application Priority Data
Sep. 18, 2009   (NO) .................................. 20093022

(51) Int. Cl.
*G02B 7/18* (2006.01)
*G02B 7/182* (2006.01)
(Continued)

(52) U.S. Cl.
CPC ............ *G02B 7/1827* (2013.01); *G02B 26/001* (2013.01); *G02B 26/0858* (2013.01); *H01L 41/0926* (2013.01); *H01L 41/0973* (2013.01); *H01L 41/18* (2013.01); *H01L 41/1876* (2013.01)

(58) Field of Classification Search
CPC . G02B 26/002; G02B 6/29361; G02B 26/001
USPC ........... 356/480, 506, 519; 359/260, 578, 579
See application file for complete search history.

(56) References Cited

U.S. PATENT DOCUMENTS 4,859,060 A * 8/1989 Katagiri ................. G10D 5/266
356/454
6,178,033 B1    1/2001 Ford et al.
(Continued)

FOREIGN PATENT DOCUMENTS

JP     2007206480 A    8/2007
WO     WO-0224570 A1   3/2002
(Continued)

OTHER PUBLICATIONS

Andreassen, Jon, "International Search Report" for PCT/EP2010/063628, as mailed Jan. 24, 2011, 4 pages.
(Continued)

*Primary Examiner* — Hwa Lee
(74) *Attorney, Agent, or Firm* — Winstead PC

(57) ABSTRACT

The present invention relates to an actuator for moving a rigid element, e.g. an optical element such as mirror (1), the element being mechanically coupled to a frame (4) with a bendable coupling (2A), wherein actuator elements (3A, 3B) are mounted on said coupling between the frame and element, the coupling and actuator elements being adapted to provide a movement to the element when subject to signal from a signal generator.

10 Claims, 5 Drawing Sheets

(51) Int. Cl.
  *G02B 26/00* (2006.01)
  *G02B 26/08* (2006.01)
  *H01L 41/09* (2006.01)
  *H01L 41/18* (2006.01)
  *H01L 41/187* (2006.01)

(56) References Cited

U.S. PATENT DOCUMENTS

| | | |
|---|---|---|
| 6,379,510 B1 | 4/2002 | Kane et al. |
| 6,830,944 B1 | 12/2004 | Smits |
| 7,265,477 B2 * | 9/2007 | Wan ............ 310/309 |
| 7,359,124 B1 | 4/2008 | Fang et al. |
| 7,369,723 B1 | 5/2008 | Mescher |
| 2004/0027671 A1 | 2/2004 | Wu et al. |

FOREIGN PATENT DOCUMENTS

| | | |
|---|---|---|
| WO | WO-2006/110908 A1 | 10/2006 |
| WO | WO-2008/100153 A1 | 8/2008 |
| WO | WO-2008/100154 A1 | 8/2008 |

OTHER PUBLICATIONS

Sagberg, Hakon, et al., "Infrared detection of carbon monoxide with a micromechanically tunable silicon Fabry-Perot filter", IEEE Conference on Optical MEMS (2005), 2 pages.

Raeder, H., et al., "Taking piezoelectric microsystems from the laboratory to production", J Electroceram, 2007, 19:357-362, 6 pages.

Neumann, Norbert, et al., "Tunable infrared detector with integrated micromachined Fabry-Perot filter", J. Micro/Nanolith., MEMS MOEMS 7, Feb. 10, 2004, 2008, 13 pages.

* cited by examiner

FABRY-PEROT INTERFEROMETER WITH PIEZOELECTRIC ACTUATOR CONTRACTING IN RADIAL DIRECTION ON MEMBRANE

The present invention relates to an actuator unit for moving a rigid, preferably optical, element, e.g. a mirror. It especially relates to an actuator for moving a micro mirror with a stroke of more than 9 μm at 20V formed out of a silicon-on-insulator wafer with integrated piezoelectric actuators is presented. The primary application is a Fabry-Perot Interferometer for infrared gas spectroscopy.

In adjustable Fabry-Perot interferometers and other devices it is a challenge to provide sufficiently large and reliable displacement of a rigid optical element such as a mirror in micromechanical devices. Piezoelectric actuators have been tried but as they are limited to movements in one direction the available movements have not been sufficient.

Piezoelectric thin-films integrated with MEMS allow long-stroke actuation at low voltages [1]. An additional advantage is that piezoelectric films generate large forces, thus the actuators can be made stiffer and more robust than what is possible with commonly used electrostatic actuators. The use of such elements have been discussed in WO2006/110908, and JP2007-206480, both showing the use of piezoelectric actuators moving a rigid element. Both, however, rely of the us a bendable beams for controlling the position and orientation of the element, which is at the cost of production complexity and long term reliability of the unit. Thus it is an object of the present invention to provide a compact actuator unit being inexpensive in production using MEMS technology and providing a robust and reliably unit being controllably within the accuracy necessary for optical use such as interferometers.

The object of this invention is obtained by providing an actuator unit as described above and characterized as presented in the independent claim.

Here, according to a preferred embodiment of the invention a novel micromirror is presented which is vertically deflected by using a double ring push-pull actuator. The micromirror has a wide range of applications in optics and microoptics, but the primary purpose is a Fabry-Perot Interferometer for infrared gas spectroscopy [2, 3].

The actuator unit is compatible with standard MEMS production and provides a robust means for moving micromirrors or similar rigid devices with sufficient accuracy.

The invention is described below with reference to the accompanying drawings illustrating the invention by way of examples, wherein FIG. 1a,b illustrates a moveable micro mirror according to the invention.

FIG. 2a,b illustrates a preferred embodiment of the embodiment illustrated in FIG. 1a,b.

Figure 5A:
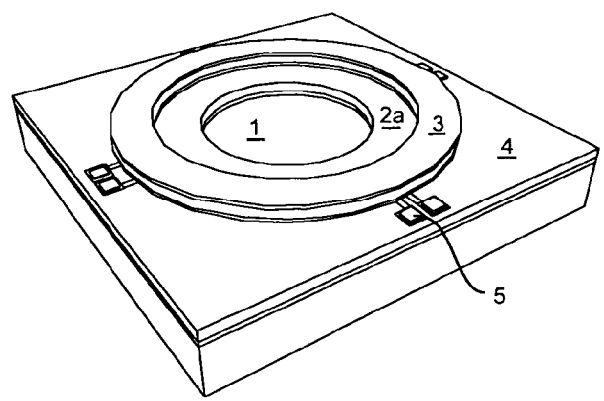
Figure 5B:
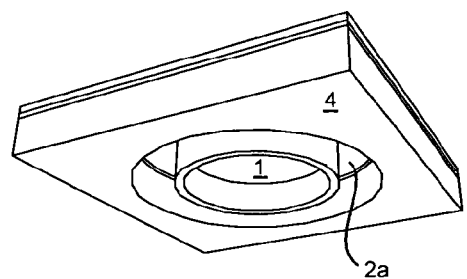
Figure 5C:
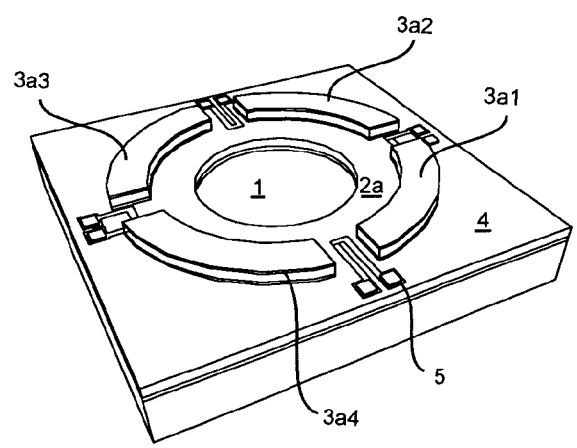

FIG. 5a-c illustrates alternative embodiments of the invention based on essentially circular membrane and piezoelectric actuators.

Figure 6A:
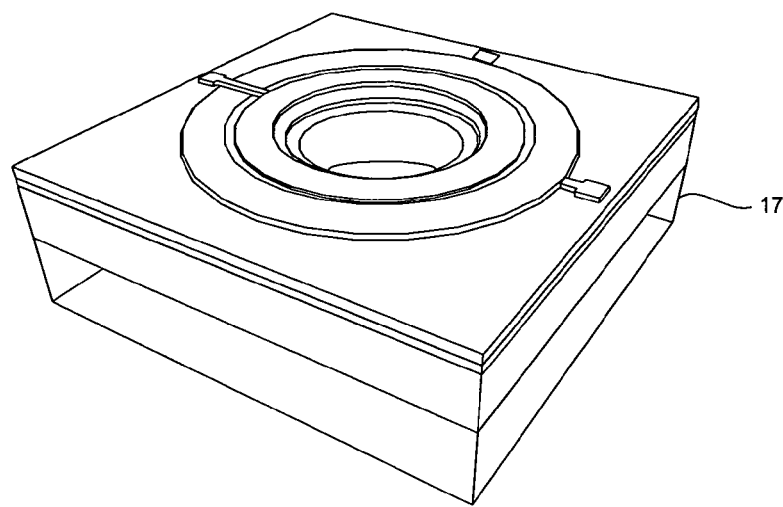
Figure 6B:
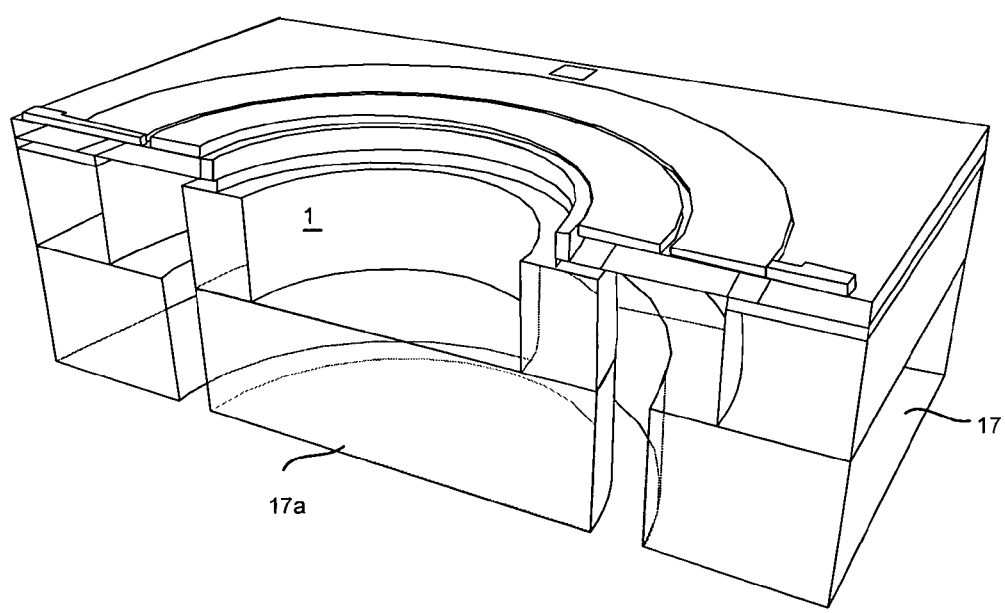

FIG. 6a-c illustrates alternative embodiments of the invention.

FIG. 7a-g illustrates the process of producing the embodiment illustrated in FIG. 6a,b,c.

Figure 1A:
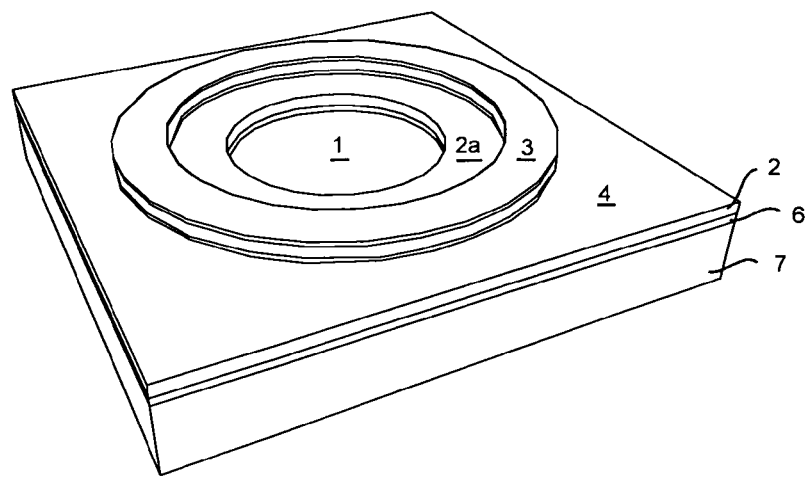

FIGS. 1a and b illustrates a 3D-model of a rigid element 1, e.g. a micro mirror, formed out of an SOI wafer comprising a thin silicon device layer 2, a buried oxide layer 6 and thick silicon handle layer 7. The device is provided with a ring-shaped piezoelectric actuator 3 positioned on membrane defining the coupling area 2a between the frame 4 and the rigid element 1. The actuator 3 deflects the disc with an open aperture in the center (FIG. 1a). The rigid element disc 1 has the full thickness of the handle silicon wafer 7 and is held in place by the thin device silicon layer 2 constituting the membrane 2a around the edge of the disc 1. The membrane 2a is shown as a continuous membrane surrounding the rigid element, but may have openings in suitable positions, e.g. for pressure equalization between the cavity beneath the element and the environment. The optical element 1 is rigid so as to maintain essentially the same shape when moved by the actuator element 3 and the actuator element 3 is preferably positioned close to either the frame 4 or the rigid element 1, so that when the piezoelectric material contracts the part of the actuator positioned on the membrane is bent upward thus pulling the membrane in that direction.

Figure 1B:
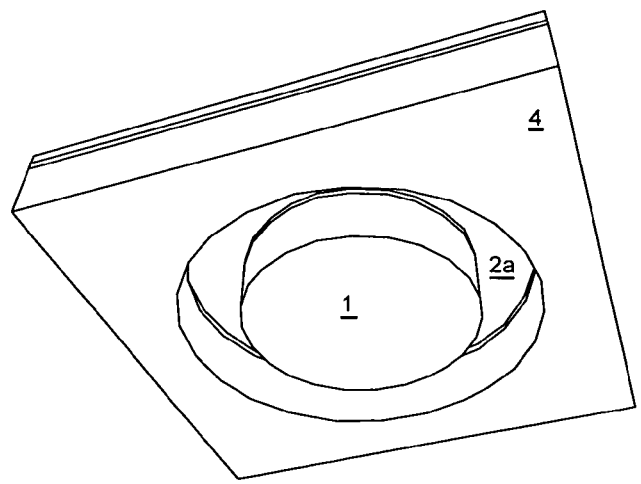

The device shown in FIG. 1a,b is formed out of a silicon-on-insulator (SOI) wafer as described above by etching away the device silicon 2 as well as the buried oxide 6 in the central portion of the device, as seen in the top view of FIG. 1a. The bottom side is shaped as seen in the bottom view of FIG. 1b, where the handle silicon layer 7 of the SOI has been etched through to the buried oxide 6, leaving a rigid element, e.g. constituting a stiff disc-shaped mirror plate 1 which is held in place by the device silicon layer 2a constituting a membrane around circumference of the rigid element 1 on its top side. A ring-shaped (i.e. annulus) piezoelectric film 3 is structured on top of the thin device silicon holding the central disc, the piezoelectric film preferably being made from lead zirconate titanate (PZT). Upon actuation, the piezoelectric film contracts in the radial direction, causing the bending of the device silicon membrane 2a through a bimorph effect. Due to the circular symmetry of the structure, this bending causes an out-of-plane deflection of the disc 1. This way an actuator unit may according to a preferred embodiment of the invention be produced being constructed from one single SOI element with PZT actuator elements applied on the surface, thus being suitable for simple and cost efficient production.

Figures 2A, 2B:
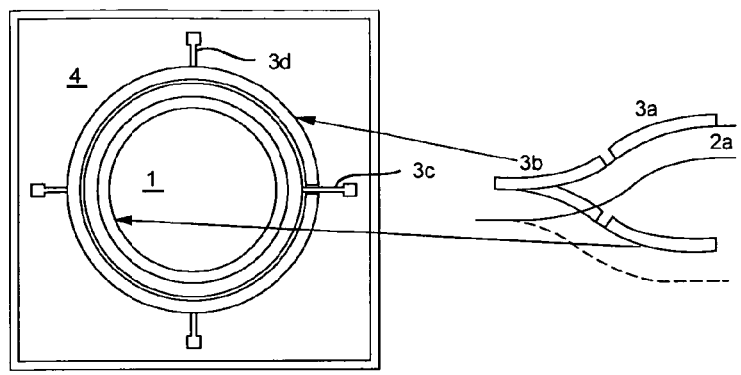

The preferred design contains two ring shaped actuators 3a,3b, as shown in FIGS. 2a and 2b. This allows push-pull actuation of the central disc, as illustrated in FIG. 2b as the membrane 2a is bent upward when outer actuator 3b is contracted while the membrane is bent downward when the inner actuator 3a is contracted. As both the frame and the rigid element are rigid the outer actuator (largest diameter) will pull the membrane and thus the optical upwards, while actuation of the inner disc (smallest diameter) will pull the membrane and thus the rigid element downwards. This solution extends the possible range of movement for the rigid element 1.

Figure 3:
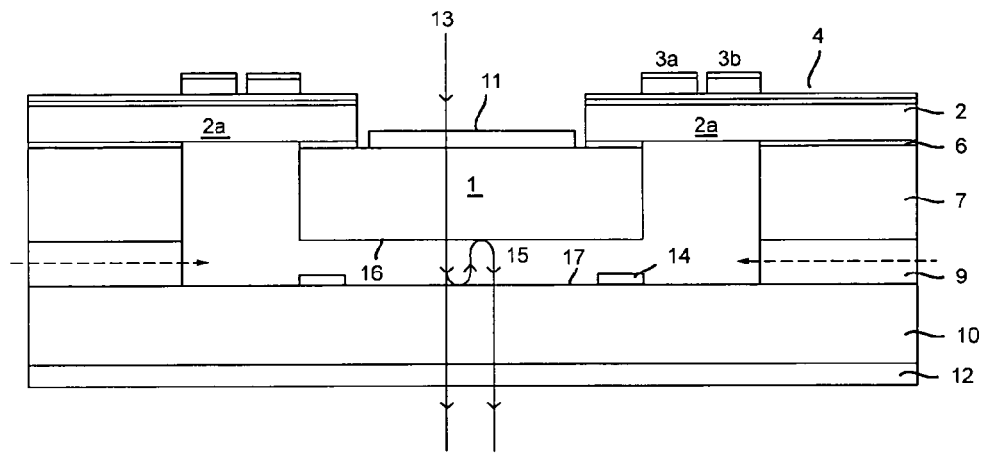
FIG. 3 illustrates a preferred embodiment of the invention used in a Fabry-Perot interferometer.

The primary application of the rigid element as a disc-shaped micromirror is as part of a Fabry-Perot Interferometer illustrated in FIG. 3. In this application, the top surface of the disc 1 is coated with an antireflective (AR) layer 11 while it is the bottom surface which acts as a mirror for the light 13 passing through the unit, but other choices may be made depending e.g. on the required distance 15 between the mirrors 16,17 formed by the surfaces above and below the cavity. The mirrors 16,17 may either be provided with reflective coatings or the refractive index of the material itself, like silicon, may provide the necessary reflectivity. By bonding (on wafer scale) the mirror to a second un-structured silicon wafer 10 which is also AR-coated on one side 12, a cavity 15 is formed in which light can undergo multiple reflections. The AR coating 11,12 and possible reflecting coatings within the resonator cavity may be provided in any suitable way, e.g. using dielectric layers at suitable thicknesses or photonic crystals.

The height of the gap 15 determines which wavelength will interfere constructively and thus be fully transmitted through the interferometer. For the FP-interferometer to be applicable to infrared spectroscopy in the wavelength range 3-10 µm, a stroke of several micrometers is desirable for sufficient tunability. The Fabry-Perot Interferometer is formed by the disc-shaped micromirror which is bonded to a second silicon wafer using adhesive bonding with a polymer such as BCB 9.

As is illustrated in FIG. 3 the Fabry-Perot may include leakage channels in the BCB layer 9 for pressure equilibration as well as end stops 14. The end stops 14 may be used for calibration, as the rigid element may be positioned at the end stops and the position may be controlled relative to this. As will be discussed below different types of position measuring means may be used, such as using optical, capacitive or piezoresistive measuring means. An end stop for the upward movement may also be provided e.g. in a housing enclosing the interferometer.

The micromirrors were fabricated as part of a multi-project-wafer (MPW) process developed and standardized for industrial use as described in [1], being included here by way of reference and will not be described in detail here. In this process the piezoelectric elements are mounted on the membrane, and the piezoelectric film used to form the actuators is lead zirconate titanate (PZT) which is sandwiched between a bottom platinum electrode and a top electrode made by gold. For the fabrication of the micromirror, the wet-etch of the backside cavity was replaced by deep reactive ion etching (DRIE) for better dimensional control.

Other means for mounting the piezoelectric elements 3 on the membrane area 2a may also be contemplated depending on the available technology and intended use of the element.

The starting SOI wafer used according to the preferred embodiment of the invention has 380 µm handle silicon 7, 300 nm buried oxide 6, and a device silicon layer 2 of 8 µm. For the fabrication of the micromirrors, the backside etch was carried out using deep reactive ion etching (DRIE).

Note that the micromirror is designed so that the part of the device silicon layer holding the central mirror disc is not structured in the region where it bridges the backside gap etched into the handle silicon, but forms a continuous membrane. This increases the robustness of the structure significantly and keeps the monocrystalline silicon free from any defect which could easily form cracks if strained in the fabrication process.

After dicing, the piezoelectric actuators of the finished devices were poled by applying 20V at a temperature of 150° C. for 10 minutes.

Measurements have been performed using a finished micromirror of the type shown in FIG. 2. where the region in the middle is the clear aperture, which for the device shown has a diameter of 3 mm and the double ring actuators 3a,3b have top electrodes 3c,3d of gold.

The actuation characteristic of the mirror was measured with a ZYGO white light interferometer. The mirror was pushed downwards by applying 20V to the inner actuator, and upward with a voltage of 20V is applied to the outer ring. Note that the mirror disc remains perfectly flat in both cases. This is due to the high stiffness of the silicon disc which has the full thickness of the handle silicon wafer.

The high stiffness of the mirror disc also allows the fabrication of much larger diameter mirrors than the 3 mm presented here. The structures formed were found to be incredibly robust, thus apertures of 5-10 mm should be feasible.

Figure 4:
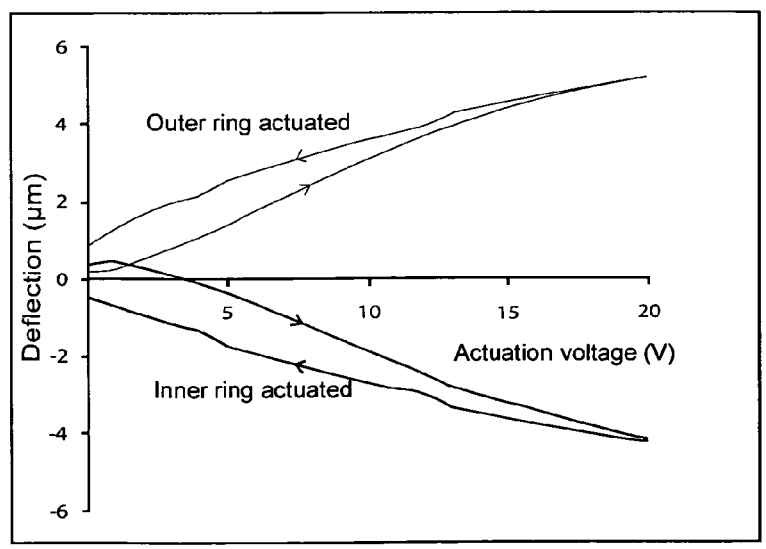
FIG. 4 shows the obtained deflection of an embodiment as illustrated in FIG. 2a,b.

The complete characteristic for the micromirror with the two actuators is shown in FIG. 4. A total stroke of 9.3 µm for the mirror plate is achieved when applying an actuation voltage of 20V to each of the two actuators in sequence. The hysteresis is a typical feature of PZT-based actuators. Feedback is needed for accurate positioning. This can be done optically by using a reference laser. In future designs, however, piezoresistors will be added to the device silicon which is part of the actuators to allow closed-loop operation and highly accurate positioning of the mirror. The actuation characteristic of the micromirror thus provides an actuator in which voltage sweep going from 0 to 20V applied to the outer actuator ring generates the upper curve, while applying the same sweep to the inner ring generates the lower curve. The total stroke is 9 µm.

Thus a micromirror was presented, which achieves a stroke of 9 nm at 20V by using a dual ring, push-pull actuator. The mirror is formed out of the handle silicon of an SOI wafer. The high stiffness ensures a high planarity upon actuation. Large mirrors with apertures of more than 3 mm were successfully fabricated. The mirror is highly suited for its primary application which is a Fabry-Perot Interferometer for gas spectroscopy.

FIGS. 5a-5c illustrates embodiments of the invention based on the ring shaped membrane 2a providing the coupling means between the rigid element 1 and the frame 4. In FIG. 5a piezoresistors 5 are positioned beneath the piezoelectric actuator 3, thus measuring the bend in the membrane at the same position that the bend is provided.

FIG. 5b illustrates that the rigid element, while being rigid at the edges, may have a rigid frame enclosing a hole or hollow area having a thin central membrane.

FIG. 5c illustrates another ring shaped membrane 2a but wherein the actuator is split along the circumference into four sections $3a_1, 3a_2, 3a_3, 3a_4$. According to the preferred embodiment of the invention corresponding inner actuator parts will be provided. In FIG. 5c the position measuring means being provided as piezoresistors 5 are positioned in the gaps between the actuator sections. An advantage with the split actuator sections is that they may provide a tilt movement in addition to the translational movement and thus some adjustments or calibrations in the position and orientation of the rigid element.

FIGS. 6a, and 6b illustrates an alternative embodiment of the invention, wherein rigid element 1 has a central opening and an optical element 17a made from a glass or quarts is fastened to it, as is seen in the cross section of the unit shown in FIG. 6b. Thus the rigid element 1 may comprise an element 17a having a suitable transmission spectrum suitable for the relevant wavelengths if used in an optical measurement such as a Fabry-Perot filter. This way the unit may be used in the visible, near infrared or ultra violet ranges, depending on the chosen material, while a rigid element 1 made from silicon will be suitable for wavelengths above approximately 1100 nm.

FIGS. 7a-7g describes the production process for making the unit shown in FIG. 6b, where the drawings show cross sections of the unit in different stages of the production.

Figure 7A:
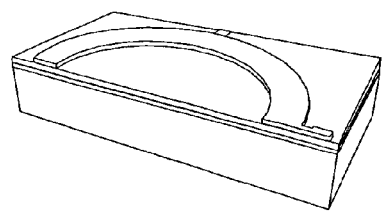
Figure 7B:
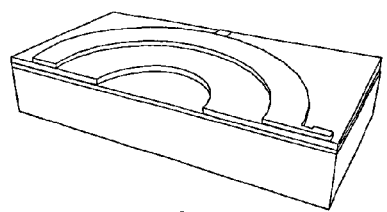

As can bee seen in FIGS. 7a and 7b this unit shares the same starting point as the other embodiments discussed above, starting with an SOI structure with a piezoelectric actuator ring as discussed with reference to FIGS. 1a,3 and 5a, and wherein the device layer is etched from the area to be used as rigid element 1.

Figure 7C:
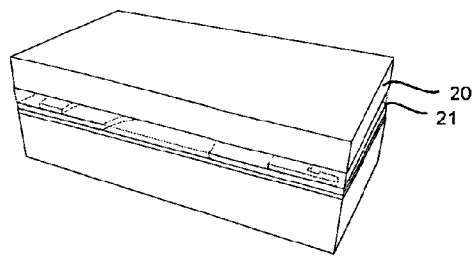
Figure 7D:
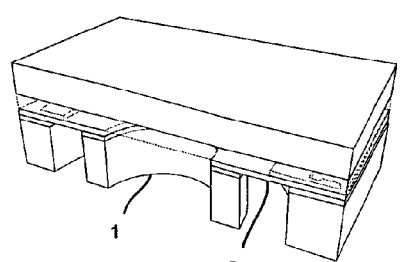

The top of the unit carrying the piezoelectric actuator is then bonded temporarily to a carrying wafer 20 as shown in FIG. 7c. This may be performed using a polymer 21 such as WaferBOND from Brewer Science. The central area as well as the membrane area is then etched away as shown in FIG. 7d leaving an opening in the central area where the device layer was removed and a membrane where the device layer was intact.

Figure 7E:
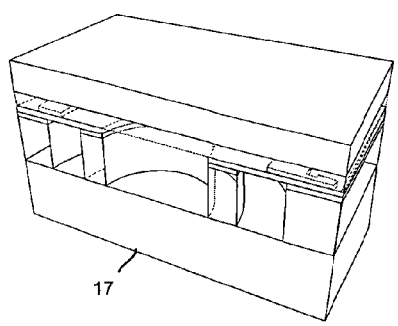

A glass or quartz layer is then bonded to the unit from below, e.g. using BCB bonding, as illustrated in FIG. 7e. The bonding has to be strong enough to keep the wafer and glass connected permanently, and BCB bonding is suitable due to the combination of relatively low temperature and high strength.

Figure 7F:
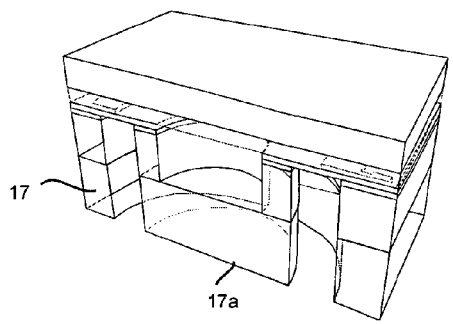
Figure 7G:
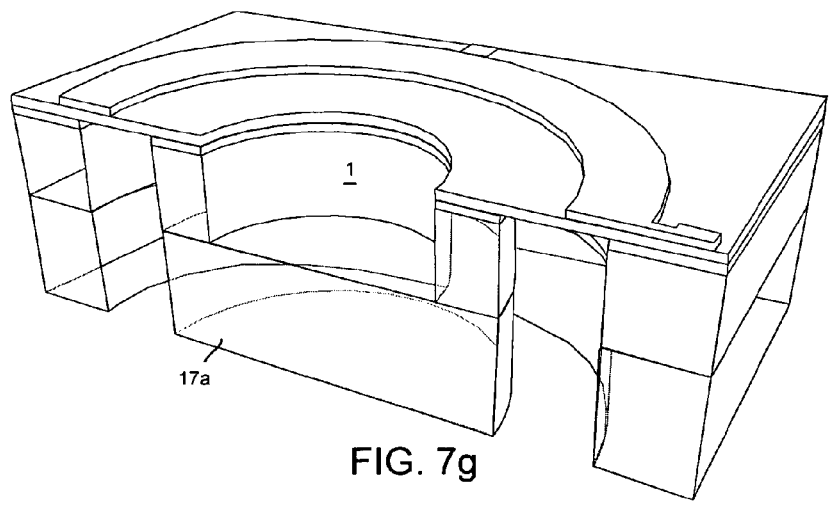

The active part 17a of the optical element constituting a part of the rigid element is then separated from the rest of the glass or quartz layer by in example powder blasting, leaving the structure illustrated in FIG. 7f.

After removing the temporary carrying wafer the unit is finished and may be mounted in an optical unit similar to the unit illustrated in FIG. 3, but where the unstructured silicon layer 10 may be a glass or quartz layer being transparent in the same wavelength ranges as the transparent part 17a of the rigid element 1. Suitable anti reflection and reflective layers may be applied to the surfaces in any well know suitable manner.

To summarize the invention thus relates to an actuator for moving a rigid element, e.g. an optical element such as a lens, a mirror or an at least partially transparent and partially reflective window, where the element is mechanically coupled to a frame with a bendable membrane providing a coupling. Actuator elements are mounted on said coupling membrane between the frame and element, the membrane and actuator elements being adapted to provide a movement to the element when subject to signal from a signal generator. Preferable the actuator elements are constituted by at least piezoelectric element mounted on said coupling membrane being adapted to bend said coupling at the application of a voltage, as the piezoelectric element is adapted to contract in the direction of the coupling between the frame and the rigid element.

In an especially preferred embodiment each actuator element is constituted by two PZT elements, the first being mounted on the coupling close to the frame, the second being mounted on the coupling close to the rigid element, and coupled to the signal generator in such a ways as to be operated independently of each other or preferably in an alternative fashion so that one of them moves the rigid element in a first direction and the other moves the rigid element in the direction opposite of the first.

In one embodiment of the invention the coupling is constituted by a thin, circular section of the frame, said at least one piezoelectric element extending along the coupling. In a preferred version two piezoelectric elements are used as described above to increase the length of movement.

In any embodiment the actuator may be provided with position measuring means to provide feedback on the position of the rigid element relative to the frame, and in the embodiment using piezoelectric elements 3 the position measuring means is preferably also a piezoresistive element 5 provided on the coupling to monitor the bend of the coupling. The piezoresistive elements 5 may be positioned beneath the piezoelectric actuators 3 or in other positions where the coupling is bent.

The piezoresistors can be made in the silicon on insulator layer by ion implantation and subsequent annealing. With this doping procedure a pn-junction can be produced, which defines the geometry of the resistors. The resistor can be contacted with additional, higher doped areas which are connected with a metallization layer on the surface in later process steps. The process steps to fabricate the piezoresistors can be performed before depositing the bottom electrode for the piezoelectric layer. Such doped piezoresistors are used as stress sensors and normally assembled in a Wheatstone bridge configuration with four bendable resistors. Other configurations e.g. a half bridge are also possible depended on the available space in the mechanical structure and process tolerances.

Instead of piezoresistors optical or capacitive solutions may be used to measure the position of the rigid element.

As illustrated in FIG. 3 the invention also relates to an interferometer including an actuator according as described above, especially a Fabry-Perot interferometer. The rigid element has an at least partially reflective surface, the frame being mounted in a housing comprising a second reflective surface, at least one of the reflective surfaces being provided on an at least partially transparent body and the two reflective surfaces being positioned at a distance from each other constituting a Fabry-Perot element, the distance being adjusted by the movements induced by said actuator elements.

The invention is also related to a reflecting device including an actuator, where the rigid element constitutes a mirror or is at least partially transparent within a chosen wavelength range and the piezoelectric actuators are divided into individually controlled circle segments being capable of tilting the rigid element so as to adjust for misalignment or direct the light in a chosen direction.

REFERENCES

[1] "Taking piezoelectric microsystems from the laboratory to production", H. Raeder, F. Tyholdt, W. Booij, F. Calame, N. P. Østbø, R. Bredesen, K. Prume, G. Rijnders, and P. Muralt, J Electroceram (2007) 19:357-362

[2] "Infrared detection of carbon monoxide with a micromechanically tunable silicon Fabry-Perot filter", Håkon Sagberg, Alain Ferber, Karl Henrik Haugholt, and Ib-Rune Johansen, IEEE Conf. on Optical MEMS (2005)

[3] "Tunable infrared detector with integrated micromachined Fabry-Perot filter", Norbert Neumann, Martin Ebermann, Steffen Kurth, and Karla Hilleri, J. Micro/Nanolith. MEMS MOEMS 7, 021004 (2008)

The invention claimed is:

1. An interferometer comprising:
   an optical element;
   a frame;
   a bendable membrane that couples the optical element to the frame, the bendable membrane extending from an outer circumference of the optical element to the frame;
   at least one piezoelectric actuator that is substantially mounted on said bendable membrane between the frame and the optical element, the at least one piezoelectric actuator being adapted to contract in a radial direction and bend the bendable membrane to provide a movement to the optical element subject to signal from a signal generator;
   an at least partially reflective surface disposed on the optical element;
   a housing comprising:
      an at least partially transparent body;
      a second reflective surface, at least one of the at least partially reflective surface and the second reflective surface being provided on an at least partially transparent body;
   wherein the frame is mounted in the housing; and
   wherein the at least partially reflective surface and the second reflective surface are positioned at a distance from each other constituting a Fabry-Perot element, the distance being adjusted by the movements induced by said at least one piezoelectric actuator.

2. The interferometer according to claim 1, comprising two piezoelectric elements, a first piezoelectric element being mounted on a coupling on a side of the membrane that corresponds to the frame, a second piezoelectric element being mounted on the membrane on a side of the membrane that corresponds to the optical element, thus being able to pull the optical element both up and down.

3. The interferometer according to claim 1, wherein the membrane comprises a thin, circular element, at least one arcuate piezoelectric element extending along the membrane around a rigid element.

4. The interferometer according to claim 3, wherein the arcuate piezoelectric element is divided into a number of individually controlled sections.

5. The interferometer according to claim 1, wherein the membrane comprises a number of actuator elements distributed along the membrane surrounding a rigid element.

6. The interferometer according to claim 1 comprising a position measuring means monitoring the position of a rigid element relative to the frame.

7. The interferometer according to claim 6, wherein the position measuring means includes a piezoresistor applied on a coupling in a position so as to indicate the bend of the coupling and thus the position if the optical element relative to the frame.

8. The interferometer according to claim 6, wherein the position measuring means includes a capacitive or optical sensor adapted to measure the position if the optical element relative to the frame.

9. The interferometer according to claim 1, wherein said at least one piezoelectric actuator is a lead zirconate titanate (PZT) actuator.

10. An interferometer comprising:
an optical element;
a frame;
a bendable membrane that couples the optical element to the frame, the bendable membrane extending from an outer circumference of the optical element to the frame;
a first piezoelectric actuator that is substantially mounted on said bendable membrane proximate the frame;
a second piezoelectric actuator that is substantially mounted on said bendable membrane proximate the optical element;
the first piezoelectric actuator and the second piezoelectric actuator being adapted to contract in a radial direction and bend the bendable membrane to provide a movement to the optical element subject to signal from a signal generator;
an at least partially reflective surface disposed on the optical element;
a housing comprising:
    an at least partially transparent body;
    a second reflective surface, at least one of the at least partially reflective surface and the second reflective surface being provided on an at least partially transparent body;
wherein the frame is mounted in the housing; and
wherein the at least partially reflective surface and the second reflective surface are positioned at a distance from each other constituting a Fabry-Perot element, the distance being adjusted by the movements induced by at least one of the first piezoelectric actuator and the second piezoelectric actuator.

* * * * *